United States Patent
Lin et al.

(10) Patent No.: US 9,312,438 B2
(45) Date of Patent: Apr. 12, 2016

(54) NITRIDE LIGHT EMITTING DIODE AND FABRICATION METHOD THEREOF

(71) Applicant: XIAMEN SANAN OPTOELECTRONICS TECHNOLOGY CO., LTD., Xiamen (CN)

(72) Inventors: Wen-Yu Lin, Xiamen (CN); Meng-Hsin Yeh, Xiamen (CN); Kechuang Lin, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 14/719,269

(22) Filed: May 21, 2015

(65) Prior Publication Data

US 2015/0270439 A1 Sep. 24, 2015

Related U.S. Application Data

(63) Continuation of application No. PCT/CN2013/088924, filed on Dec. 10, 2013.

(30) Foreign Application Priority Data

Jan. 11, 2013 (CN) .......................... 2013 1 0010488

(51) Int. Cl.
- *H01L 33/14* (2010.01)
- *H01L 27/15* (2006.01)
- *H01L 33/00* (2010.01)
- *H01L 33/32* (2010.01)
- *H01L 33/06* (2010.01)

(52) U.S. Cl.
CPC .............. *H01L 33/14* (2013.01); *H01L 27/156* (2013.01); *H01L 33/0025* (2013.01); *H01L 33/0075* (2013.01); *H01L 33/06* (2013.01); *H01L 33/32* (2013.01)

(58) Field of Classification Search
None
See application file for complete search history.

(56) References Cited

U.S. PATENT DOCUMENTS

| 6,072,819 | A * | 6/2000 | Shakuda | H01L 33/145 257/E33.005 |
|---|---|---|---|---|
| 6,242,761 | B1 * | 6/2001 | Fujimoto | H01L 33/145 257/102 |
| 2010/0012920 | A1 * | 1/2010 | Park | H01L 33/14 257/13 |
| 2010/0207160 | A1 * | 8/2010 | Park | H01L 33/145 257/103 |
| 2011/0095262 | A1 * | 4/2011 | Yoo | H01L 33/145 257/13 |

FOREIGN PATENT DOCUMENTS

EP 2317574 A2 5/2011

* cited by examiner

*Primary Examiner* — William Coleman
*Assistant Examiner* — Kien Ly
(74) *Attorney, Agent, or Firm* — Syncoda LLC; Feng Ma; Junjie Feng

(57) ABSTRACT

An epitaxial structure of light emitting diode with a current modulation layer, and more specifically, a high-resistivity material is injected to change the current conduction path, and implementation of the main structure is to grow a high-resistivity material (e.g., $In_xAl_yGa_{1-x-y}N$) over the N-type conductive layer or the P-type conductive layer till part of current conduction path is exposed through high-temperature $H_2$ in-situ etching in the reacting furnace and to grow the N-type or the P-type conductive layer for coverage. This design for forming a current modulation layer without second epitaxial growth provides the injected current with a better spreading path in the N-type conductive layer and the P-type conductive layer, which more effectively and uniformly injects the current to the active layer and improves luminous efficiency.

12 Claims, 4 Drawing Sheets

NITRIDE LIGHT EMITTING DIODE AND FABRICATION METHOD THEREOF

CROSS-REFERENCE TO RELATED APPLICATIONS

The present application is a continuation of, and claims priority to, PCT/CN2013/088924 filed on Dec. 10, 2013, which claims priority to Chinese Patent Application No. 201310010488.1 filed on Jan. 11, 2013. The disclosures of these applications are hereby incorporated by reference in their entirety.

BACKGROUND

In existing GaN light emitting diode, the P-side current flows through the transparent conductive layer from the P-type electrode and injects to the P-type conductive layer and even the active layer. However, on the one hand, since the hole concentration of the P-type conductive layer is generally low ($10^{16}$ cm$^{-3}$-$10^{17}$ cm$^{-3}$) and the hole mobility is mostly below 10 cm$^2$/Vs, it is difficult for current to be uniformly distributed in the P-type conductive layer, which may lead to current crowding and excessive heat and finally influence luminous efficiency. In addition, luminous intensity is high under the electrode due to high current density. However, the light emitted is easily shielded by the electrode or absorbed by material after reflection, resulting in light output power loss.

On the other hand, though electrical conductivity of the N-type conductive layer is not as strict as that of the P-type conductive layer, a satisfied luminous efficiency is available if uniformly-distributed current is injected into the active layer.

SUMMARY

The present disclosure provides an epitaxial structure of light emitting diode with a current modulation layer, and more specifically, a high-resistivity material is injected to change the current conduction path and to improve luminous efficiency. And implementation of the main structure is to grow a high-resistivity material (e.g., In$_x$Al$_y$Ga$_{1-x-y}$N) over the N-type conductive layer or the P-type conductive layer till part of current conduction path is exposed through high-temperature H$_2$ in-situ etching in the reacting furnace and to grow the N-type or the P-type conductive layer for coverage. A plurality of light-emitting diodes disclosed herein can be included in a light-emitting system, such as a lighting system or a display system.

According to a first aspect of the present disclosure, a nitride light emitting diode, comprising an N-type conductive layer, a P-type conductive layer, and a light-emitting layer between the N-type conductive layer and the P-type conductive layer; a current modulation layer is at least included in the N-type conductive layer or the P-type conductive layer, comprising a nitride insulation material layer with opening structure, in which, the opening structure for current conduction is etched by injecting H$_2$ into the epitaxial growth reacting furnace.

Preferably, the current modulation layer can be undoped In$_x$Al$_y$Ga$_{1-x-y}$N, in which, 0≤x≤0.1, 0≤y≤1, 0≤x+y≤1, about 50 nm-200 nm thick. The opening structures of random and discrete distribution are in-situ etched by high-temperature H$_2$ in the reacting furnace with distribution density of 1×10$^4$ cm$^{-2}$-1×10$^8$ cm$^{-2}$ and diameter d of 50 nm-200 nm.

According to a second aspect of the present disclosure, a fabrication method of nitride light emitting diode, depositing an N-type conductive layer, a light-emitting layer and a P-type conductive layer through epitaxial growth, in which: a current modulation layer is at least formed in the N-type conductive layer or the P-type conductive layer, comprising a nitride insulation material layer with opening structure, in which, the opening structure for current conduction is etched by injecting H$_2$ into the epitaxial growth reacting furnace.

Preferably, the current modulation layer is made of undoped In$_x$Al$_y$Ga$_{1-x-y}$N (0≤x≤0.1, 0≤y≤1, 0≤x+y≤1) and formed in the N-type conductive layer (or the P-type conductive layer) following the steps below: firstly, forming an N-type conductive layer (or a P-type conductive layer) through epitaxial growth; depositing a nitride insulation material layer over the N-type conductive layer (or the P-type conductive layer); injecting H$_2$ to the epitaxial growth reacting furnace to etch the nitride insulation material layer until part of the N-type conductive layer (or the P-type conductive layer) is exposed, thus forming an opening structure for current conduction; continuing epitaxial growth of the N-type conductive layer (or the P-type conductive layer) to form a current modulation layer in the N-type conductive layer (or the P-type conductive layer), in which, H$_2$ concentration H$_2$/NH$_3$=2.5–10, and etching temperature is 900° C.-1200° C.

In this present disclosure, during epitaxial growth, the nitride high-resistivity insulation material is etched by directly adopting high-temperature H$_2$ in the growth environment to form current conduction path. This method for forming a current modulation layer without second epitaxial growth provides the injected current with a better spreading path in the N-type conductive layer and the P-type conductive layer, which more effectively and uniformly injects the current to the active layer and improves luminous efficiency.

100: growth substrate; 200: light-emitting epitaxial layer; 210: N-type conductive layer; 220: light-emitting layer; 230: electron blocking layer; 240: P-type conductive layer; 250: current modulation layer; 251: nitride insulation material; 252: opening part; 301: N electrode; 302: P electrode.

DETAILED DESCRIPTION

Figure 4:
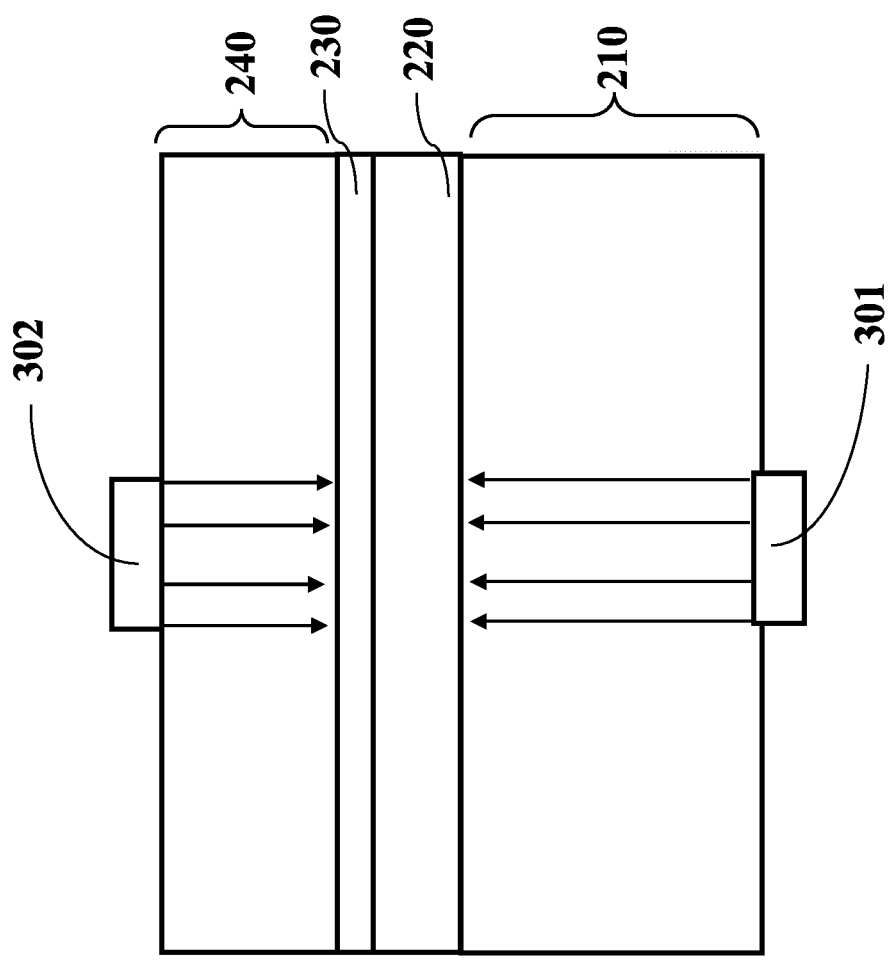
FIG. 4 shows the current conduction path of existing light emitting diode chip.

FIG. 4 shows current crowding in conventional nitride light emitting diode device, in which, the current distribution density is uneven with the lower electrode having maximum current density and high luminous intensity. However, the light emitted is easily shielded by the electrode or absorbed by material after reflection, thus influencing luminous efficiency of device. Therefore, a key study point is about how to improve current distribution uniformity in industry.

Chinese patent ZL200410062825.2 discloses a nitride semiconductor laser with an AlN current narrow layer in the p-type photoconductive layer of the active layer. The striped-line structure of this laser can be fabricated following the steps below: firstly, forming an AlN current narrow layer over the element in the MOCVD reacting furnace at 400-600° C. till the p-type photoconductive layer; taking the element out of the reacting furnace and forming striped-shaped opening part through photoetching with alkaline etching solution; putting the element into the MOCVD reacting furnace again to grow a p-type photoconductive layer that buries the opening part of the current narrow layer; and further laminating p-type metal cladding layer in successive.

U.S. Pat. No. 7,817,692 discloses a GaN compound semiconductor laser having a current narrow layer with a striped-shaped opening part. To prevent etching of striped-shaped opening part from excessively etching and damaging the epitaxial layer, a current narrow layer is formed over the semiconductor layer with Al ratio less than that of the current narrow layer.

In the above patents, striped-shaped nitride semi-conductor insulation material over the nitride laser diode N-type conductive layer or P-type conductive layer serves as the current blocking layer, requiring photolithography and second epitaxial growth.

In this present disclosure, the current modulation layers in the N-type conduction region and the P-type conduction region are formed by only one epitaxial growth in the furnace, thus saving costs for elimination of second epitaxial growth and other additional processes and avoiding yield decrease due to surface pollution from second epitaxial growth.

Detailed description will be given to specific implementation of the present invention in combination with the embodiments and drawings. In the embodiments below, form a current modulation layer in the N-type conductive layer and the P-type conductive layer respectively. It is to be understood that these embodiments are only preferred embodiments of the present disclosure without restricting a formation of such structure at both P and N sides provided that a current modulation effect is achieved in the N-type conductive layer or the P-type conductive layer.

Figure 1:
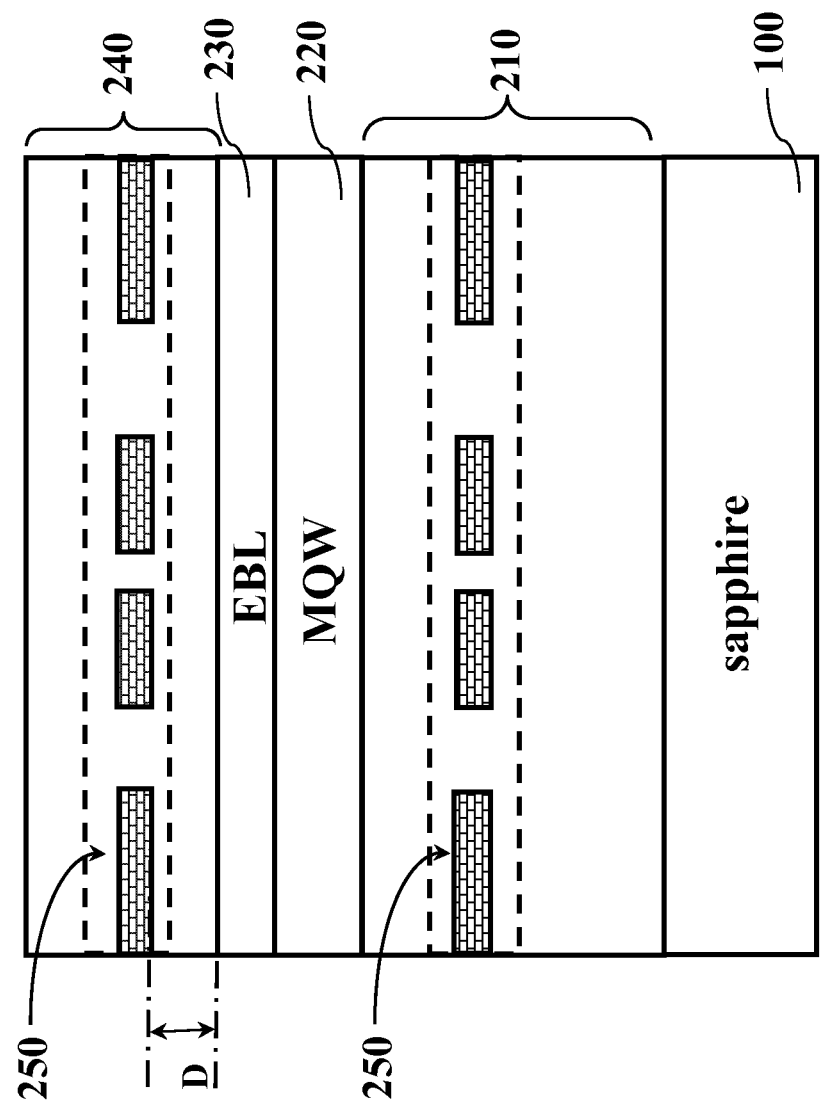
FIG. 1 is a schematic diagram of the epitaxial structure of light emitting diode with a current modulation layer according to present disclosure.

With reference to FIG. 1, deposing an N-type conductive layer 210, a light-emitting layer 220 and a P-type conductive layer 240 over the growth substrate 100 to form a light-emitting epitaxial layer 200, in which, the growth substrate 100 can be sapphire, silicon carbide or gallium nitride that is applicable to epitaxial growth of the nitride semiconductor material layer. A buffer layer can be further deposited between the N-type conductive layer 210 and the growth substrate 100 to improve lattice quality of the light-emitting epitaxial layer.

Figure 2:
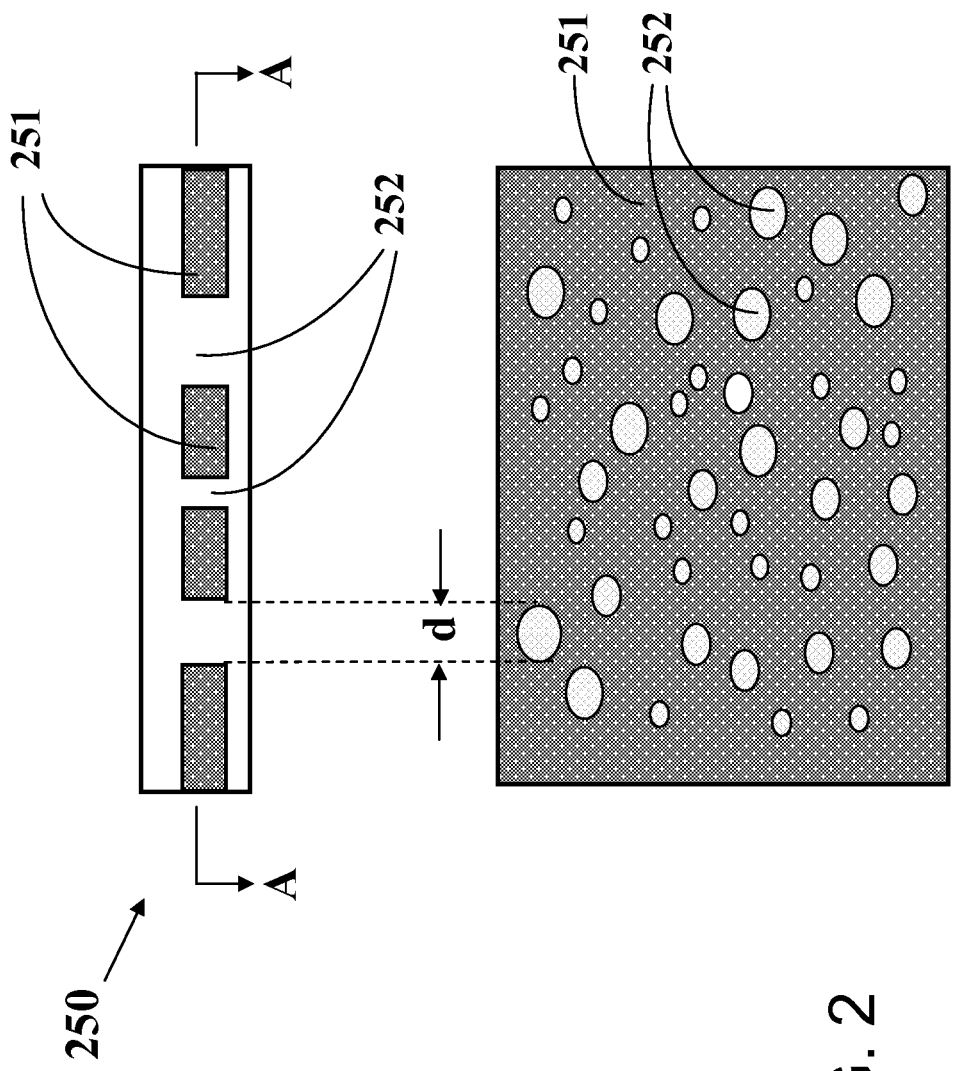
FIG. 2 is cross section view and section view of the epitaxial structure of light emitting diode with a current modulation layer as shown in FIG. 1.

The N-type conductive layer 210 is an n-Ga N-layer and a current modulation layer 250 is inside the N-type conductive layer, which is suggested to have a certain distance to the bottom surface of the N-type conductive layer 210 or is directly placed on the bottom of the N-type conductive layer 210. The current modulation layer 250 is a high-resistivity insulation material layer 251 with opening structure 252. The high-resistivity insulation material layer 251 can be made of $In_xAl_yGa_{1-x-y}N$, in which, to guarantee high resistivity of $In_xAl_yGa_{1-x-y}N$, AlN, GaN or other materials undoped with Si or Mg (i.e., un-doped $In_xAl_yGa_{1-x-y}N$), can be used in growth of this layer. The N-type conductive layer 210 can be formed following the steps below: growing an N—GaN material over the growth substrate 100; growing a 50 nm-200 nm un-doped $In_xAl_yGa_{1-x-y}$ N-layer 251; injecting $H_2$ into the reacting furnace to etch un-doped $In_xAl_yGa_{1-x-y}$ N-layer 251, and forming opening structures 252 of random distribution in the un-doped $In_xAl_yGa_{1-x-y}$ N-layer, in which, etching conditions inside the reacting furnace can be set as follows: $H_2$ concentration $H_2/NH_3=2.5-10$, etching temperature: 900-1200° C. and etching time: 30 sec-600 sec; growing the N—Ga N-layer continuously, which fills in the opening structures and covers the AlN-layer 251 to form a flat epitaxial surface; and finally forming the current modulation layer 250 as shown in FIG. 2. A series of openings 252 are distributed over the AlN-layer 251 at distribution density of $1\times10^4$ $cm^{-2}$-$1\times10^8$ $cm^{-2}$ and each opening diameter d at 50 nm-200 nm.

The light-emitting layer 220 generally is made of In gallium nitride compounds, which is a multi-quantum well structure preferably, and specifically, a layer comprising $In_{x1}Ga_{1-x1}N$ well layers ($0<x1<1$) and $In_{x2}Ga_{1-x2}N$ barrier layers ($0\leq x2<1$, $x1>x2$) after appropriate times of alternation.

An electron blocking layer 230, generally made of AlGaN, can also be arranged between the light-emitting layer 220 and the P-type conductive layer; such electron blocking layer is about 10 nm-60 nm thick and has enough high barrier to restrict and prevent the N-type injected electron from overflowing to the P-type layer.

The P-type conductive layer 240 is made of p-GaN layer. Inside the P-type conductive layer, a current modulation layer 250 is also included, which has a certain distance D (about 50 nm-200 nm) to the bottom layer of the P-type conductive layer 210, thus preventing etching and decomposition of the un-doped $In_xAl_yGa_{1-x-y}N$ inside the furnace from damaging the electron blocking layer or the light-emitting layer. The structure and fabrication method are basically same as those of the current modulation layer in the N-type conductive layer, which will not be illustrated again.

Figure 3:
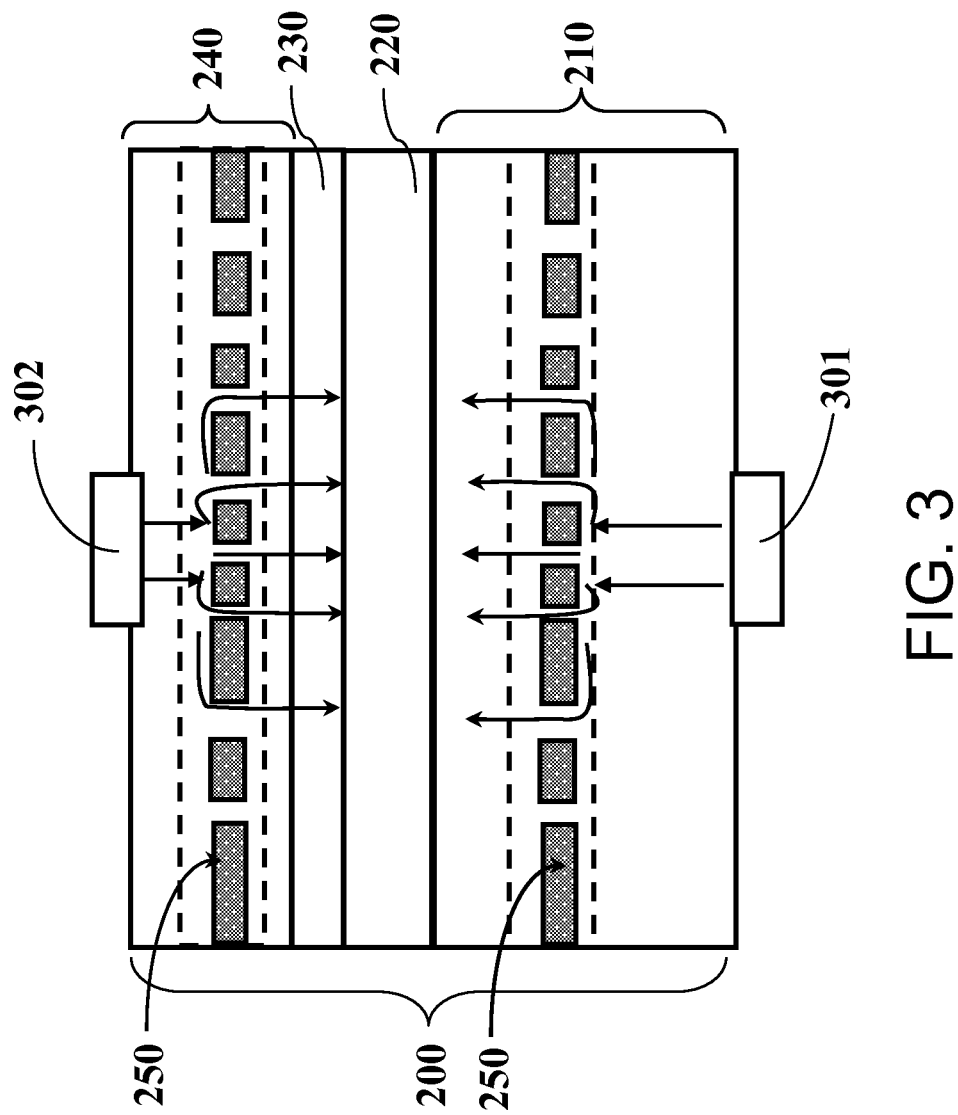
FIG. 3 shows the current conduction path of a LED chip fabricated from the light emitting diode epitaxial structure as shown in FIG. 1.

FIG. 3 shows the current conduction path of a LED chip fabricated from the light emitting diode epitaxial structure as shown in FIG. 1. As shown in the figure, by controlling density and size of the openings, current conducted from electrode changes its current path significantly influenced by the current modulation layer, thereby increasing current distribution uniformity. In addition, when depositing un-doped $In_xAl_yGa_{1-x-y}N$ in $H_2$, a decomposition reaction is generated at dislocation to leave un-doped $In_xAl_yGa_{1-x-y}N$ of randomly-distributed openings of better lattice quality, which is helpful for future growth of the N-type or the P-type conductive layer.

Further, in this embodiment, the in situ epitaxial growth of structure inside the furnace avoids photolithography and second epitaxial growth, which prevents electrical abnormality of optoelectronic device from interface pollution due to exposure to air.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A nitride light emitting diode, comprising an N-type conductive layer, a P-type conductive layer, and a light-emitting layer between the N-type conductive layer and the P-type conductive layer; a current modulation layer in at least one of the N-type conductive layer or the P-type conductive layer and comprising a nitride insulation material layer with opening structures, wherein the opening structure is configured for current conduction and is etched by injecting $H_2$ into an epitaxial growth reacting furnace; and wherein the opening structures of the current modulation layer have a random and discrete distribution.

2. The nitride light emitting diode of claim 1, wherein the current modulation layer is undoped $In_xAl_yGa_{1-x-y}N$, wherein $0 \leq x \leq 0.1$, $0 \leq y \leq 1$, $0 \leq x+y \leq 1$.

3. The nitride light emitting diode of claim 1, wherein the opening structures of the current modulation layer is located at regions with relatively poor lattice quality in the nitride insulation material layer.

4. A nitride light emitting diode, comprising an N-type conductive layer, a P-type conductive layer, and a light-emitting layer between the N-type conductive layer and the P-type conductive layer; a current modulation layer in at least one of the N-type conductive layer or the P-type conductive layer and comprising a nitride insulation material layer with opening structures, wherein the opening structure is configured for current conduction and is etched by injecting $H_2$ into an epitaxial growth reacting furnace; and wherein a distribution density of the opening structures of the current modulation layer is $1 \times 10^4$ cm$^{-2}$-$1 \times 10^8$ cm$^{-2}$.

5. The nitride light emitting diode of claim 1, wherein a distance from a bottom surface of the current modulation layer and a bottom surface of the P-type conductive layer is 50 nm-200 nm.

6. The nitride light emitting diode of claim 1, wherein the current modulation layer is about 50 nm-200 nm thick.

7. A light-emitting system comprising a plurality of nitride light-emitting diodes, each diode including an N-type conductive layer, a P-type conductive layer, and a light-emitting layer between the N-type conductive layer and the P-type conductive layer; a current modulation layer in at least one of the N-type conductive layer or the P-type conductive layer and comprising a nitride insulation material layer with opening structures, wherein the opening structure is configured for current conduction and is etched by injecting $H_2$ into an epitaxial growth reacting furnace; and wherein a distribution density of the opening structures of the current modulation layer is $1 \times 10^4$ cm$^{-2}$-$1 \times 10^8$ cm$^{-2}$.

8. The system of claim 7, wherein the current modulation layer is undoped $In_xAl_yGa_{1-x-y}N$, wherein $0 \leq x \leq 0.1$, $0 \leq y \leq 1$, $0 \leq x+y \leq 1$.

9. A light-emitting system comprising a plurality of nitride light-emitting diodes, each diode including an N-type conductive layer, a P-type conductive layer, and a light-emitting layer between the N-type conductive layer and the P-type conductive layer; a current modulation layer in at least one of the N-type conductive layer or the P-type conductive layer and comprising a nitride insulation material layer with opening structures, wherein the opening structure is configured for current conduction and is etched by injecting $H_2$ into an epitaxial growth reacting furnace; and
wherein the opening structures of the current modulation layer have a random and discrete distribution.

10. The system of claim 9, wherein the opening structures of the current modulation layer are located at regions with relatively poor lattice quality in the nitride insulation material layer.

11. The system of claim 7, wherein a distance from a bottom surface of the current modulation layer and a bottom surface of the P-type conductive layer is 50 nm-200 nm.

12. The system of claim 7, wherein the current modulation layer is about 50 nm-200 nm thick.

\* \* \* \* \*